Jan. 11, 1955 R. W. CARLISLE ET AL 2,699,471

AMPLIFIER CHASSIS STRUCTURE AND CASING FOR VARIABLE ELECTRONIC HEARING AIDS

Filed Nov. 25, 1949 7 Sheets-Sheet 1

INVENTORS.
Richard W. Carlisle
Paul Gundersheim
William H. Greenbaum

M. S. Pineles
ATTORNEY

Jan. 11, 1955

R. W. CARLISLE ET AL

AMPLIFIER CHASSIS STRUCTURE AND CASING FOR VARIABLE ELECTRONIC HEARING AIDS 2,699,471

Filed Nov. 25, 1949

7 Sheets-Sheet 2

INVENTORS
RICHARD W. CARLISLE
PAUL GUNDERSHEIM
WILLIAM H. GREENBAUM

BY [signature]

ATTORNEY

INVENTORS
RICHARD W. CARLISLE
PAUL GUNDERSHEIM
WILLIAM GREENBAUM

ATTORNEY

FIG. 12
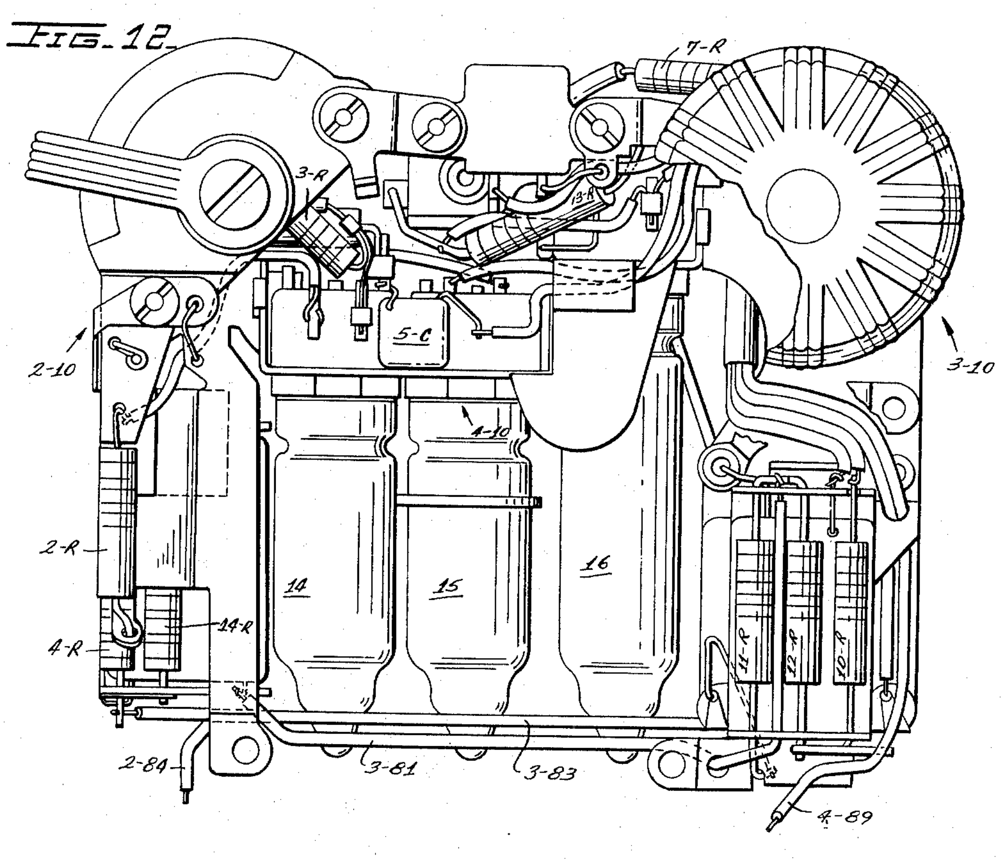
FIG. 13
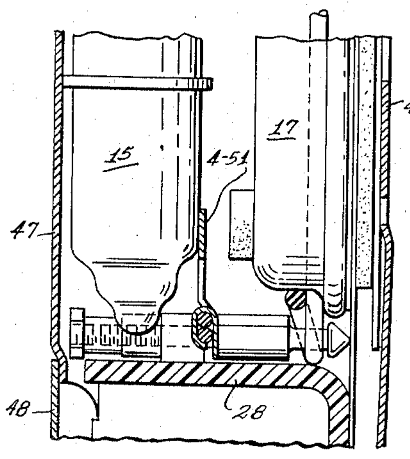
FIG. 12-A
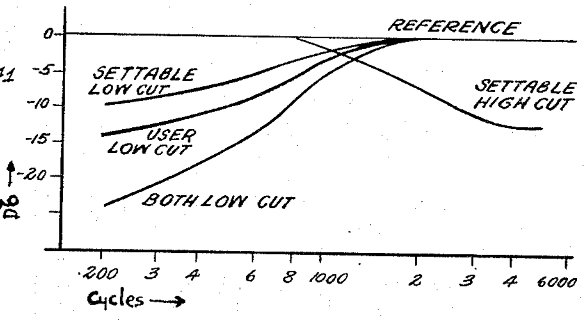
INVENTORS
RICHARD W. CARLISLE
PAUL GUNDERSHEIM
WILLIAM GREENBAUM
BY M. S. Pinelis
ATTORNEY

INVENTORS
RICHARD W. CARLISLE
PAUL GUNDERSHEIM
WILLIAM H. GREENBAUM

BY M. S. Pincles
ATTORNEY

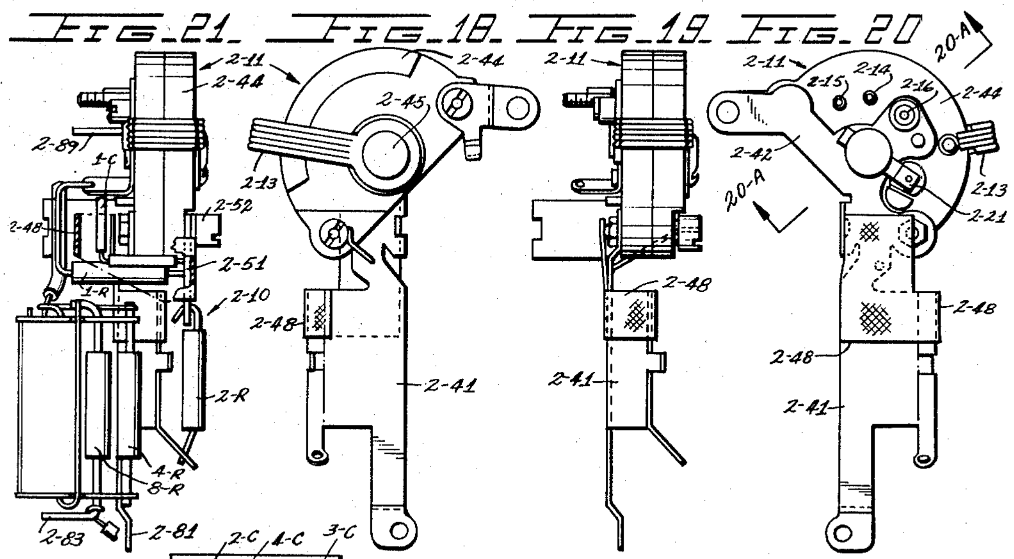
FIG. 21, FIG. 18, FIG. 19, FIG. 20
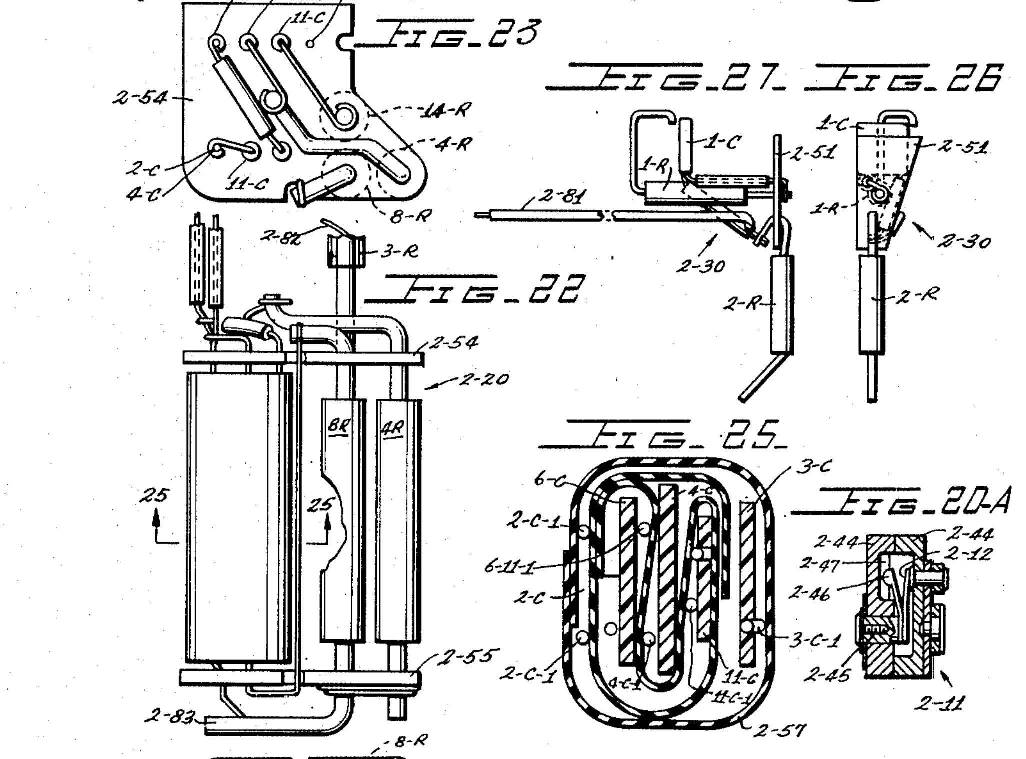
FIG. 23, FIG. 22, FIG. 27, FIG. 26, FIG. 25, FIG. 20-A
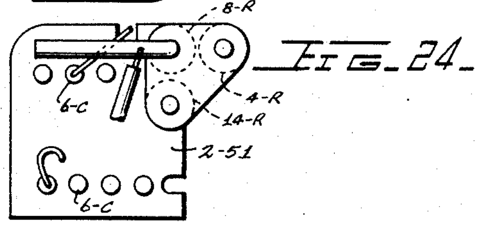
FIG. 24
INVENTORS
RICHARD W. CARLISLE
PAUL GUNDERSHEIM
WILLIAM H. GREENBAUM
BY M. S. Pineles
ATTORNEY

INVENTORS
RICHARD W. CARLISLE
PAUL GUNDERSHEIM
WILLIAM H. GREENBAUM

BY M. S. Pinelis
ATTORNEY

United States Patent Office 2,699,471

Patented Jan. 11, 1955

2,699,471

AMPLIFIER CHASSIS STRUCTURE AND CASING FOR VARIABLE ELECTRONIC HEARING AIDS

Richard W. Carlisle and William H. Greenbaum, Elmsford, and Paul Gundersheim, Yonkers, N. Y., assignors to Sonotone Corporation, Elmsford, N. Y., a corporation of New York Application November 25, 1949, Serial No. 129,374

10 Claims. (Cl. 179—107)

This invention relates to wearable hearing aids, and particularly to electron-tube amplifier hearing aids, all the principal elements of which except for the receiver are housed in a flat, small casing, small enough to be inconspicuously worn on the body of the user.

Among the objects of the invention are arrangements and combination of the elements of such hearing aid which enable their mounting and assembly in the small flat housing space in a manner which will assure minimum feed-back coupling between circuit parts of different signal potential; that simplify the assembly of the component parts within small available space while reducing to a minimum the thickness of the casing required for housing the hearing aid amplifier unit; that simplify the servicing of the amplifier unit, and assure that the humidity sensitive parts of the amplifier unit resist corrosion and deleterious effects of moisture and heat to which a hearing aid is subjected when worn on the body of the user.

Most of the hard-of-hearing or deafened persons are very sensitive and seek to conceal their impairment. Accordingly, a practical hearing aid must be light, small and compact so that it may be worn comfortably and inconspicuously on the body of the user. In addition, it must be simple and fool-proof in operation and it should require little attention so as to free the user from mental and physical strain as well as annoyances to which he is subjected when the instrument has to be repaired or checked up.

To meet the foregoing requirements, it is essential that the electron tube hearing aid amplifier be not only compact and small, but that all elements of the amplifer unit shall be readily accessible for speedy repair and reconditioning, without introducing complications when one or another circuit element of the amplifier has to be removed or replaced. In addition, it is also essential that all parts of the hearing aid amplifier shall have a high degree of immunity to moisture and heat, and that it should not be deleteriously affected by humidity and heat when worn hidden under the clothing of the body of the user.

In addition, it is also very desirable that such electron tube amplifier hearing aid should have in addition to a power cut-off control switch and a volume control structure, additional control units for selectively reducing or cutting the low-frequency response in at least two stages, for selectively cutting the high-frequency response, and for reducing the maximum power output level to suit the individual requirement of different users. Because of the requirement for utmost compactness, prior hearing aids had to be made by embodying therein only some but not all of the foregoing complementary controls.

One phase of the present invention resides in combining within a compact structure of an amplifier hearing aid in addition to the power cut-off control switch structure and the volume control rheostat structure, the following additional selectively settable controls:

(*a*) The power cut-off control switch is combined with switch elements enabling the user to selectively reduce or cut the low-frequency response. The user is thus able to cut the low-frequency response when the low-frequency background noise is objectionable, and also if his particular hearing impairment does not require the available low-frequency response.

(*b*) An additional low-frequency cut-off switch accessible only in the interior of the amplifier casing for enabling the person fitting the instrument to selectively set the response of the hearing aid in the low-frequency range in accordance with the individual requirements of the user, as indicated for instance, by his audiogram or by his response to articulation tests.

(*c*) A high-frequency response cut-off switch accessible only in the interior of the amplifier casing, which enables the person fitting the instrument to selectively reduce the available high-frequency response to a level which is not objectionable and not painful to the user.

(*d*) A maximum power control switch accessible only in the interior of the amplifier casing for enabling the person setting the instrument to selectively set the power of the instrument so as to meet the requirement of a user who is unable to tolerate under any conditions the maximum available power level, thereby also prolonging the life of the battery.

The foregoing and other objects of the invention will be best understood from the following description of exemplifications thereof, reference being had to the accompanying drawings, in which.

Figures 2, 3:
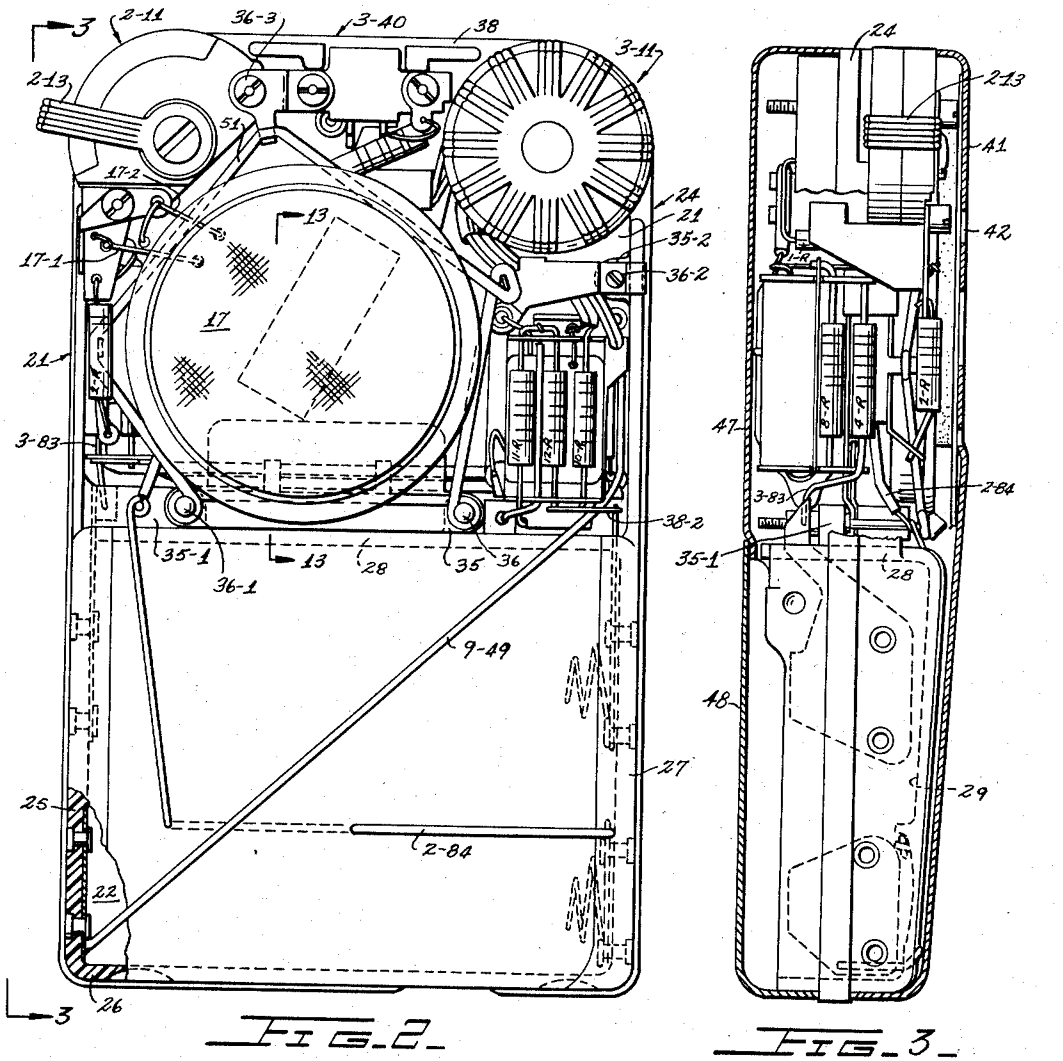
Fig. 2 is a front view of the amplifier unit of the hearing aid embodying such amplifier, with the front and rear walls of the casing removed and some of the parts broken away.
Fig. 3 is a side view of the amplifier unit with the casing and part of the amplifier chassis broken away along lines 3—3 of Fig. 2.
Figure 7:
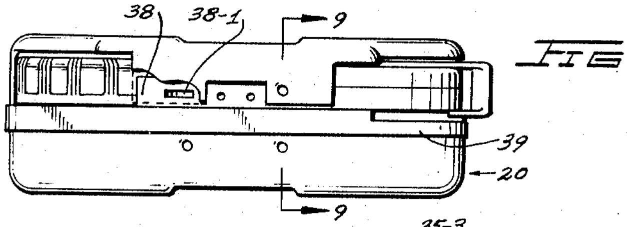
Figs. 7 and 8 are top and bottom views of the amplifier unit shown in Fig. 5.
Figure 8:
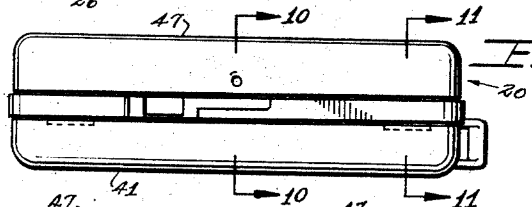
Figures 9, 10, 11:
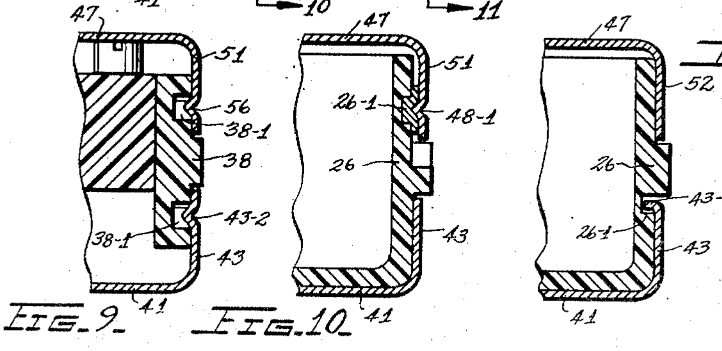
Fig. 9 is a detailed cross-sectional view along line 9—9 of Fig. 7.
Figure 14:
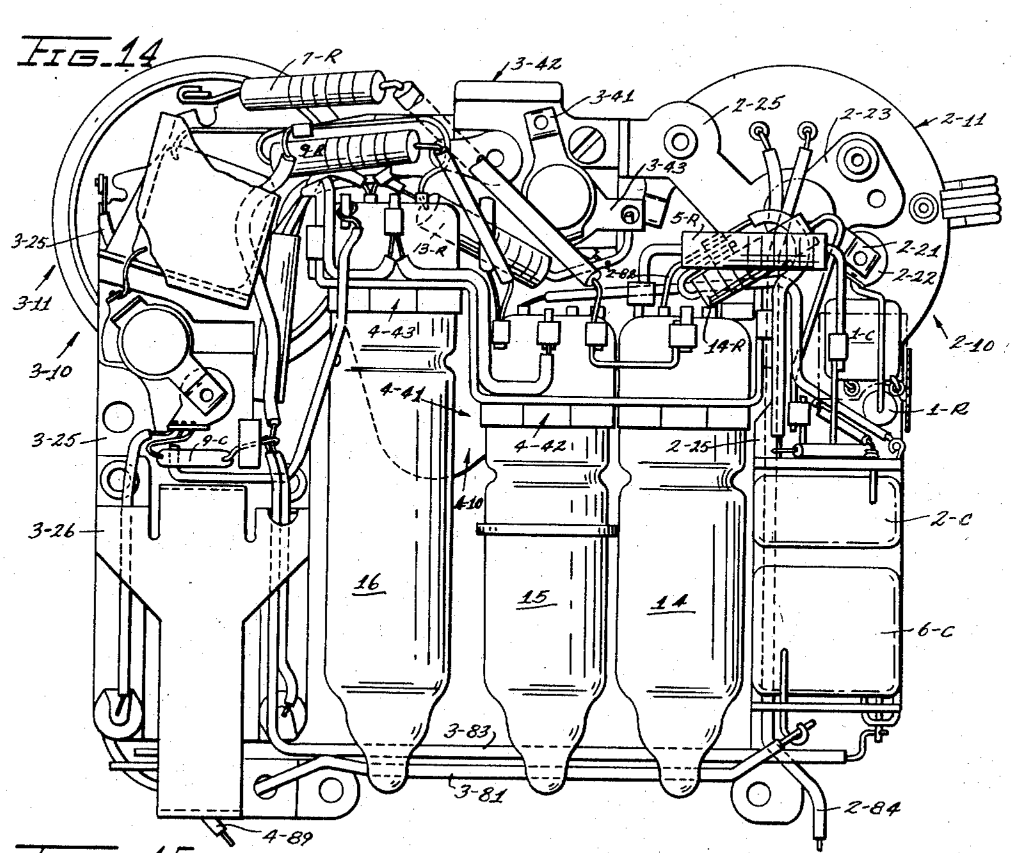
Figure 15:
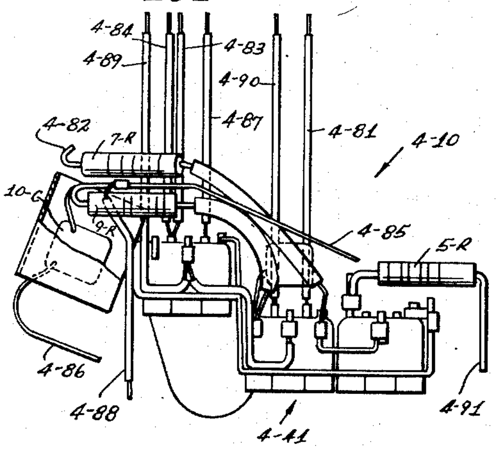
Figure 17:
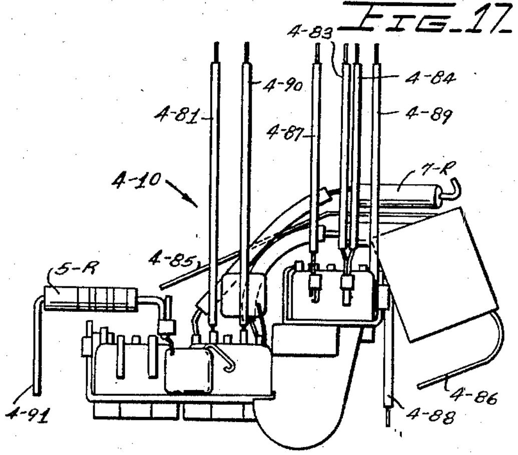
Figure 16:
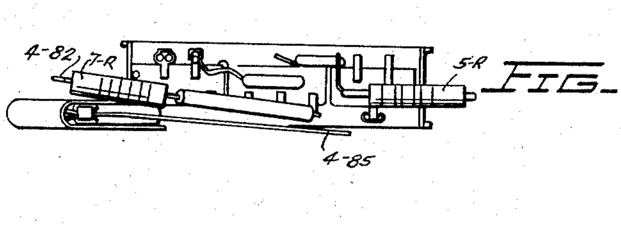
Figures 28, 29, 30:
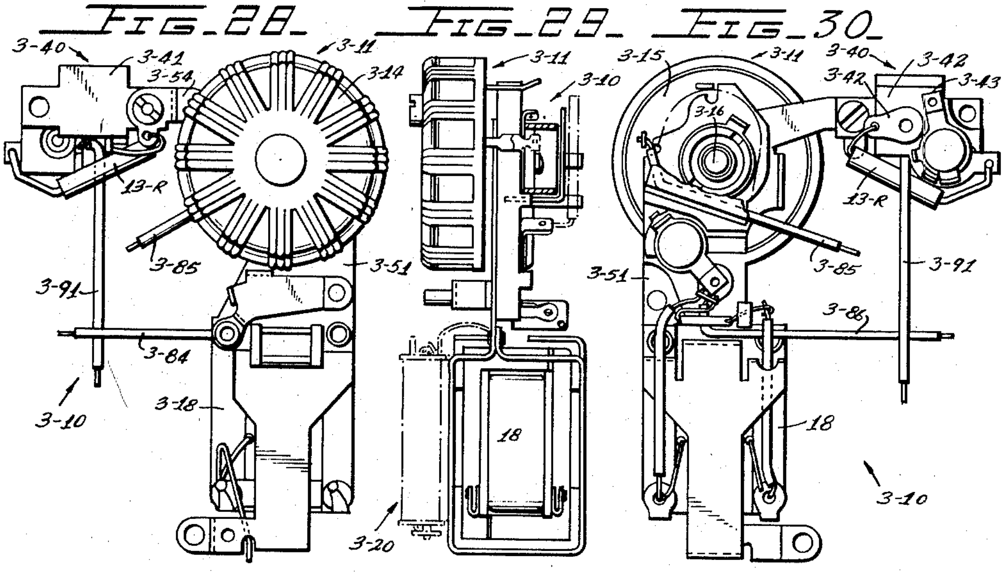
Figure 31:
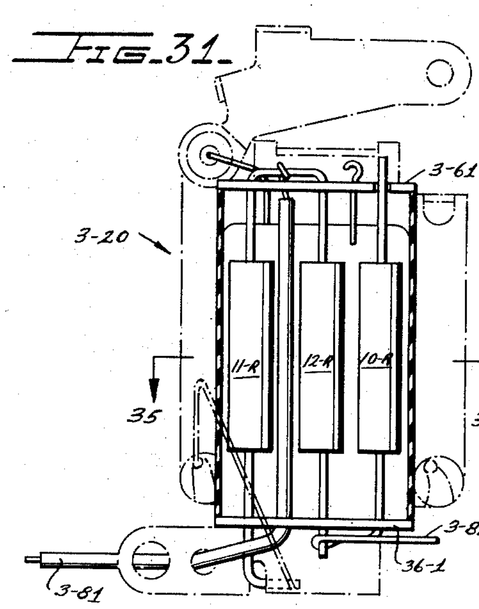
Figure 32:
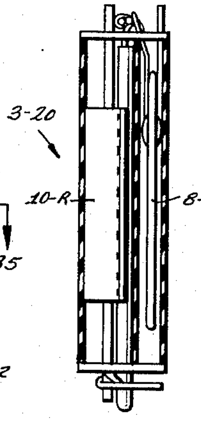
Figure 33:
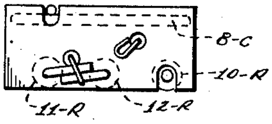
Figure 34:
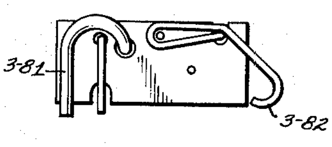
Figure 35:
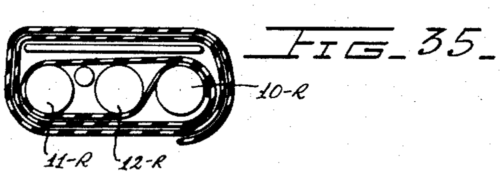

Figs. 10 and 11 are detailed cross-sectional views along lines 10—10 and 11—11 of Fig. 8;

Fig. 12 is an enlarged detailed view similar to Fig. 2 of the amplifier chassis structure without the casing;

Fig. 12–A is a curve diagram showing the various response characteristics with which the hearing aid amplifier unit shown may be set to operate;

Fig. 13 is a detailed cross-sectional view of the amplifier unit along line 13—13 of Fig. 2;

Fig. 14 is a rear view of the amplifier structure chassis shown in Fig. 12;

Fig. 15 is a view similar to Fig. 14 of one sub-assembly unit of the amplifier chassis shown in Fig. 12;

Figs. 16 and 17 are top and rear views of the sub-assembly unit shown in Fig. 15;

Fig. 18 is a view similar to Fig. 12 of the skeleton of another sub-assembly unit of the amplifier chassis shown in Fig. 12;

Figs. 19 and 20 are side and rear views of the sub-assembly unit of Fig. 18;

Fig. 20–A is a cross-sectional view along line 20–A—20–A of the sub-assembly section shown in Fig. 20;

Fig. 21 is a view similar to Fig. 19 of the same sub-assembly unit with all components thereof mounted thereon;

Fig. 22 is a view similar to Fig. 21 of a sub-assembly section thereof;

Figs. 23 and 24 are top and bottom views of the amplifier sub-assembly section of Fig. 22;

Fig. 25 is a cross-sectional view along lines 25—25 of the sub-assembly section of Fig. 22;

Fig. 26 is a view similar to Fig. 12 of another sub-assembly section of the sub-assembly unit of Fig. 21;

Fig. 27 is a side view of the sub-assembly section of Fig. 26;

Fig. 28 is a front view similar to Fig. 12 of a further sub-assembly unit of the amplifier chassis;

Figs. 29 and 30 are side and rear views of the sub-assembly unit of Fig. 28;

Fig. 31 is a view similar to Fig. 28 of a sub-assembly section which is combined therewith into a complete sub-assembly unit;

Fig. 32 is a side view of the sub-assembly section of Fig. 31 with part of the wrapping in cross-section;

Figs. 33 and 34 are top and bottom views of the sub-assembly section of Fig. 31; and Fig. 35 is a cross-sectional view along lines 35—35 of Fig. 31.

Figure 1:
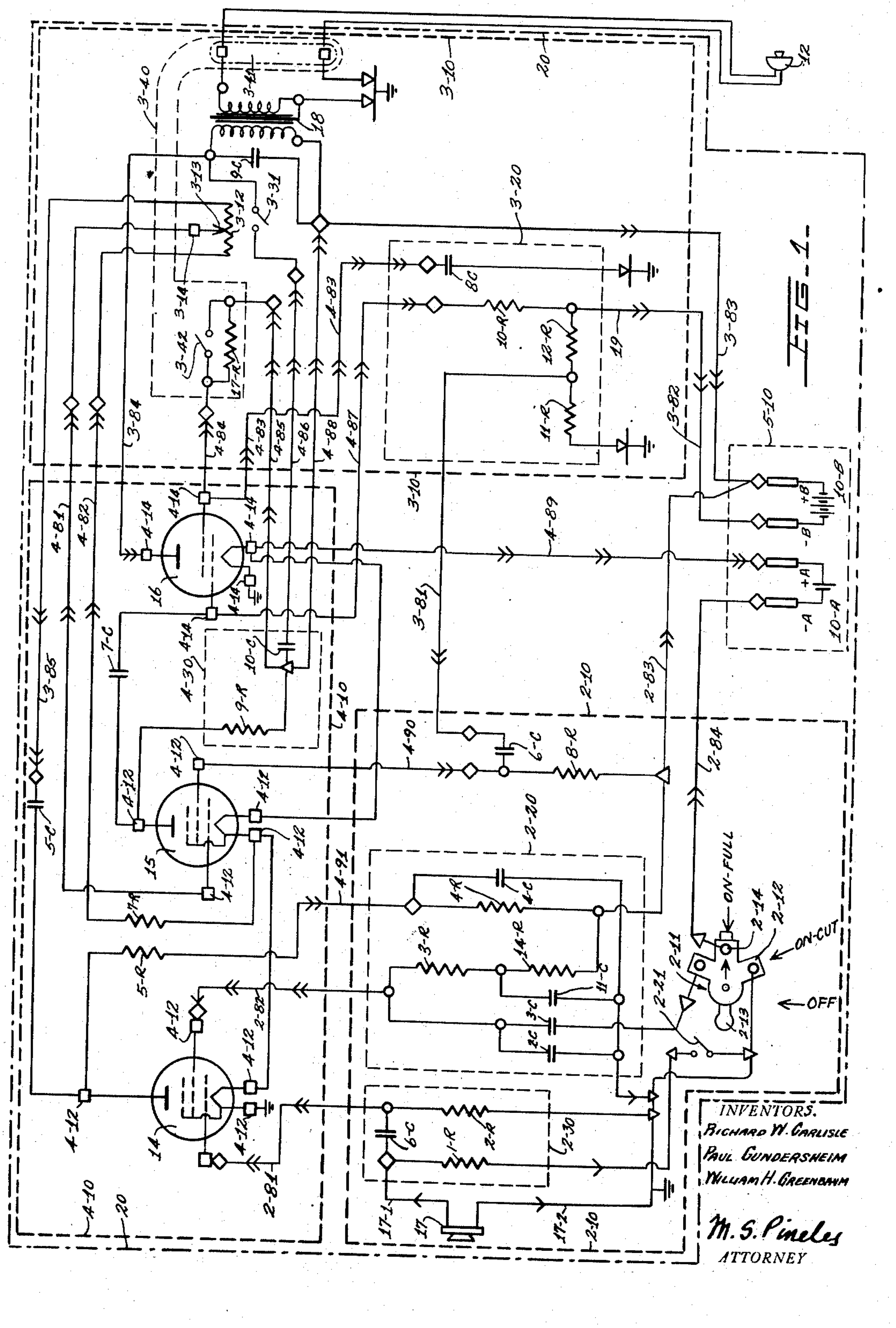
Fig. 1 is a circuit diagram of one form of an electron amplifier hearing aid in connection with which an exemplification of the invention will be described.

In the particular exemplification of the invention shown diagrammatically in Fig. 1, and structurally in Figs. 2 to 35, all elements of the hearing aid except for the receiver, generally designated 20 and indicated in Fig. 1 by dash-dot lines are enclosed in a small, flat, compact casing small enough for inconspicuous wear on the body of the user.

The receiver 12, such as an ear-phone or bone receiver, is shown connected to the amplifier circuit of the hearing aid by two leads of a thin, flexible cord 13. Within the flat casing 20 is housed an electron tube amplifier including a first gain-stage amplifier tube 14, a second gain-stage amplifier tube 15, and a power-stage amplifier tube 16. A microphone 17 impresses its signal output voltage on the control grid of the first gain tube 14 and an output transformer 18 delivers the amplified output of power tube 16 through cord 13 to the receiver 12. The microphone 17 and the transformer 18 are likewise housed within the casing 20.

The amplifier tubes 14, 15, 16 are supplied with electric power by a power unit 5–10 including the tiny A battery 10–A supplying heating current to the cathodes of the several tubes, and a tiny B battery 10–B supplying electric power to the anode or plate circuits of the several tubes.

A power-supply control unit in the form of a three-position switch, generally designated 2–11, has a movable switch member 2–12 actuable by an externally exposed actuating member 2–13 for actuating the switch member 2–12 either to the "on-full" position, or to the intermediate "on-cut" position, or to the "off" position, indicated in Fig. 1 by correspondingly labeled arrows. In the "on-full" position, as well as in the "on-cut" position, the switch member 2–12 completes an energizing circuit to the filamentary cathodes of the three tubes 14, 15, 16, thereby energizing the amplifier. When the switch member 2–12 is actuated to the "off" position, the switch member 2–12 breaks its contact connection with switch member 2–14 thereby opening the cathode energizing circuit of the three tubes.

The hearing aid shown is also provided with additional volume control structures generally designated 3–11, shown in the form of an adjustable tap resistance or rheostat 3–12 connected across the output circuit of the first gain tube so that by manually shifting the rheostat tap 3–13 with the externally exposed control member 3–14, the user may adjust the sound output to the desired level.

A grid resistor 2–R is connected to the control grid of the first gain tube, the output of which is impressed on the gain control electrode of the second gain tube 15 across a coupling impedance including resistors 5–R and 4–R. The volume control rheostat 3–12 is connected through blocking capacitor 5–C to the anodes of the first gain tube and through a suitable resistance 7–R to the cathode of the second gain tube, and the tap 3–11 of the volume control rheostat impresses an output component of the first gain tube 14 on the control grid of the second gain tube 15. A coupling resistor 9–R connected to the anode of the second gain tube impresses its output through a blocking condenser 7–C on the control grid of the power tube 16. A conventional by-pass capacitor 9–C is connected across the primary winding of the output transformer 18.

To maintain the control grid of the power tube 16 at a proper bias potential for operation as a class A amplifier, a space-current return lead 19 from the —B terminal of the B battery to the ground of the power tube 16, indicated by the conventional ground sign, has included therein two resistance elements 11–R, 12–R, for developing thereacross the proper bias voltage which is impressed upon the control grid of gain tube 16 through a circuit leading including resistor 10–R. To compensate for the degenerative signal component developed across the bias resistor elements 11–R, 12–R, by the signal output current flowing therethrough, a regenerative signal voltage component developed across bias resistor element 11–R is impressed by way of blocking capacitor 6–C on the screen grid electrode of the preceding gain tube 15, in accordance with the principles disclosed and claimed in the co-pending application, Serial No. 779,484, filed October 10, 1947, of Crownover et al.

The amplifier of the invention shown diagrammatically in Fig. 1, also includes response control elements for enabling the user to cut the low-frequency response whenever desired, for instance, is a noisy space, without reducing the intelligibility of the amplified speech signals. The response control circuit includes capacitor elements 2–C and 3–C connected across a voltage dropping resistor 3–R supplying the proper positive voltage to the screen grid of the first gain tube 14. The parameters of the circuit elements 2–C, 3–C, 11–C, 3–R, 14–R interconnected with the circuit of the screen grid of the first gain tube 14 are so chosen that when the capacitor 3–C is disconnected from the circuit, the feed-back voltage developed in the anode circuit of the amplifier, and impressed by the lead from +B through resistors 14–R, 3–R on the screen grid of the first gain tube 14, will cause the screen grid to impress on gain tube 14 a degenerating voltage for low-frequency signal and reduce the gain of the amplifier over a selected low-frequency part of the operating range. The capacitor 3–C, which is arranged to connect across the voltage dropping resistor 3–R of the screen biasing circuit of the first gain tube 14, has such high value that it forms a low impedance for the degenerative signal voltage impressed therethrough on the screen grid of the gain tube 14. When the power control switch member 2–11 is in the "on-full" position, the capacitor 3–C is connected in the circuit thereby suppressing the degenerated signal impressed on the screen grid of the first gain tube for supplying to the user the full response in the low-frequency part of the amplifier. When the user desires to cut the low-frequency response he has merely to move switch member 2–11 to the intermediate "on-cut" position in which the capacitor 3–C is disconnected from the circuit, thereby causing the screen grid of the gain tube 14 to operate with a degenerating signal voltage over the low-frequency part of the range.

The hearing aid amplifier of the invention shown is also combined with selectively operated control elements which make it possible to set the maximum power level of the instrument to meet the specific requirements of a user who is unable to tolerate under any conditions the maximum available power level of the instrument, and which also serves to cut the battery drain and thus prolong life of the battery.

In the hearing aid shown, such power level control is secured by providing in the screen grid circuit of the power tube 16 a voltage dropping resistor 13–R which may be selectively short-circuited by control switch 3–21. With this arrangement, the power amplifier tube 16 will deliver full power when the voltage dropping resistor 13–R in the screen grid circuit is short-circuited by control switch 3–21, in which case the full available positive potential is applied to the screen grid. The switch 3–21 makes it possible for the person fitting the instrument to open the switch 3–21 and thereby reduce the power level of the instrument to a desired lower setting in accordance with the requirements of the user.

In the hearing aid shown the switch 3–21 is not exposed on the interior of the hearing aid, but is accessible only after opening of the overlying rear wall portion of the casing whereupon the movable switch member 3–21 is readily accessible for setting it either in the "closed" or "open" power-cutting position.

The hearing aid shown is also provided with an additional selective response control means for enabling the person fitting the instrument to provide for additional reduction of the response in the low-frequency level in accordance with the individual requirements of users.

In the amplifier shown, there is provided to this end an additional response control circuit including a resistor 1–R, and a capacitor 1–C, and a switch arranged for co-operation with the input circuit elements of the first gain tube 14, including grid resistor 2–R and microphone 17, so that by closing the control switch 2–21 the low-frequency response of the amplifier is cut over a desired part of the frequency range, and by opening of the control switch 2–21 this response cutting action is removed. The movable switch element 2–21 of this low-frequency response control is not accessible to the user. However, upon opening of the overlying rear wall portion of the amplifier casing the switch element 2–21 is accessible to the person fitting the instrument for setting it either in the open or closed position in accordance with the requirements of the user.

The hearing aid amplifier shown, is also provided with further control elements for selectively reducing the high-frequency response of the amplifier in accordance with the requirements of the user.

In the form shown, there is provided to this end a by-pass capacitor 10–C and an associated control switch 3–31. The capacitor 10–C is so chosen in relation to the by-pass capacitor 9–C and the other elements of the power output circuit so that by manually closing the control switch 3–31 the high-frequency response may be selectively reduced to a desired lower level below the available full high-frequency response, with which the amplifier operates when the high response cut switch 3–31 is open.

In the hearing aid shown, the movable switch element of the high-frequency control switch 3–31 is not accessible to the user. Upon opening the overlying rear wall portion of the amplifier casing, the high-cut switch element 3–31 is accessible to the person fitting the instrument for setting it either in the closed high cutting position or in the open position in accordance with the requirements of the user.

Fig. 12 shows curves indicating typical changes in the response curves of a hearing aid having the foregoing response controls. The horizontal line marked "Reference" indicates the full response level of the instrument when all control switches are set for highest response over the entire frequency range, with the user's switches 2–12 in the "on-full" position shown in Fig. 1, and the fitting switches 2–13, 3–31 in the open position. By moving user switch 2–12 to the "cut-on" position, the low frequency response is lowered from the full Reference level to curve marked "User low cut." By closing the low-cut fitting switch 2–13 alone, the low-frequency response is lowered from the full Reference level to curve "Fitting low cut." With both of these switches in the low "cut" position, the low-frequency response is lowered from full Reference level to curve "Both low cut." By closing the high-cut switch 3–31 only, the high-frequency response is lowered from the full Reference level to curve "Fitting high cut."

Figure 4:
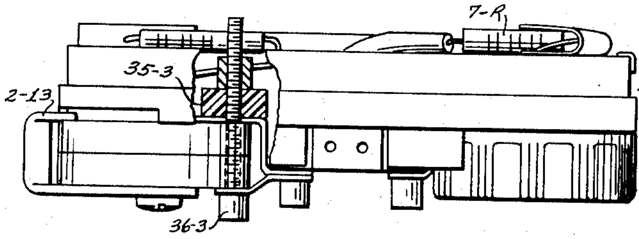
Fig. 4 is a top view of the amplifier unit of Figs. 2 and 3 with the front and rear walls of the casing removed.

In the practical exemplification of the invention shown in structural detail in Figs. 2 to 35 inclusive, all components of the hearing aid amplifier shown diagrammatically in Fig. 1, are housed in the upper amplifier compartment 21 of the amplifier casing 20. For the sake of clarity, the amplifier unit is shown in Figs. 2, 3 and 4 greatly enlarged, on a scale 1 to 2. The amplifier casing has also a lower compartment 22 in which the batteries, to wit, the A battery 10–A, and the B battery 10–B are housed (Figs. 2 to 6). The particular amplifier shown is designed for operation with a relatively wide B battery 10–B. The size of the amplifier casing shown may be further reduced by one-half of the height of the B battery 10–B occupying the battery compartment 22.

When the user does not require full power and it is sufficient to operate the hearing aid amplifier of the type shown with a B battery of half the width shown available on the market.

In the form shown, the amplifier casing 20 is formed of an extended front wall 41 and an extended rear wall 47 joined to the opposite sides of a relatively narrow border wall structure 24 made of electrically insulating molded material, for instance by injection molding. The border wall structure 24 is bound on all sides to the borders of the amplifier compartment 21, and its lower part encloses all sides of the battery compartment with the exception of its rear side which is open (Figs. 5, 6) for permitting replacement of batteries in the battery compartment 22. The upper part of the border wall structure 24 forms four relatively narrow border wall sections surrounding the four borders of the narrow amplifier compartment 21, the facing adjoining upper sections of the front wall 41 and rear wall 47 forming therewith a protective enclosure around the elements of the amplifier and the microphone housed therein. The narrow border wall sections 25, 27, facing the battery compartment 22 of the border structure 24 facing the battery have mounted thereon electrical contact elements 31, 32, 33, 34, arranged to engage terminals of the A battery 10–A and B battery 10–B inserted into the positions shown in Fig. 5 within the battery compartment. Contact elements 31, 33 are shown in the form of compressible spring for assuring good contact between the battery terminals and the cooperating terminals 31 to 34 of the battery compartment, and also to facilitate replacement of the batteries. The contact elements 31 to 34 may be secured to the insulating border wall sections of the border wall structure 24 either by embedding them within the insulating wall structure, or by small rivets, or the like.

The upper border wall section 28 of the battery compartment (Figs. 2, 5, 6) forms also one of the four border wall sections of the generally rectangular amplifier compartment 21. Lug or ear portions 35, 36, extending inwardly from the low border wall section 28 and the upper border wall section 38 of the amplifier compartment 21 provide mountings for affixing thereto the amplifier assembly or chassis structure shown in Figs. 12 and 14, which is assembled prior to mounting and affixing to the lugs 35, 36 by screws 61, 62. The microphone 17 may be a conventional flat hearing aid microphone. The particular microphone 17 shown, is of the type described in the co-pending application of Richard W. Carlisle, Serial No. 56,516, filed April 9, 1949. The microphone 17 shown is made in the form of a flat unit held suspended on a vibration suppressing suspension structure shown in the form of a loop 63 of rubber-like elastometer damping material strung around a plurality of supporting ears of the border frame structure 24 and amplifier chassis structure housed in the amplifier compartment. The vibratory diaphragm of the microphone 17 faces the inner side of the upper sound pervious section of the front wall 41 of the amplifier casing which is provided with slits or openings 42 which render it pervious to the propagation of sound from the surrounding space to the diaphragm of the microphone 17.

In the form shown the front wall 41 and the rear wall 47 of the amplifier casing are made of thin, strong sheet material that has a smooth external surface, such as thin, smooth stainless steel sheet metal.

The front wall 41 is shown provided along its four borders with inwardly bent border portions 43 arranged to interfit with a raised shoulder portion 39 and the underlying wall region of the border wall structure 24.

The front wall 41 is also provided with means for firmly retaining it in assembled closed position on the border wall structure 24 while permitting easy removal therefrom whenever desired. To this end, the lower border wall section 26 and the upper border wall section 38 of the casing (Figs. 5 to 11) is provided with recesses 26–1, 38–1 for receiving rim detents 43–1, 43–2 formed on the upper and lower rim portions 43 of the front wall 41.

The bottom rim detents 43–1 of the front wall are in the form of relatively long sheet projections extending from the rim edge and fitting correspondingly into the deep bottom recesses 26–1 of the lower border section 26, so that after insertion therein the front wall 41 is tilted to the closed position (Fig. 9) in which its upper rim detents 43–1 will elastically snap into the recesses 38–1 of the upper border wall section.

Fig. 11 shows the lower border wall section 26 of the border wall structure 24 with its relatively deep recess 26–1 arranged to receive and lock the relatively long detent 43–1 of the lower border portion 43 of the front wall 41.

Fig. 9 shows the upper wall portion 43 of the front wall 41 with its shallow detent 43–2 interlockingly engaging with an elastic snap action the shallow locking recess 38–1 of the upper border wall section 38 of the upper border wall structure 24.

As explained above, the rear wall 47 overlies and is affixed to the rear side of the amplifier compartment 21 and has a lower battery wall section 48 hingedly connected thereto. The rear wall 47 is provided with novel means for tilting it from the closed position shown in Fig. 6 to an outwardly tilted dotted line position 47–1 for providing access to the normally closed amplifier compartment and enable the person fitting the instrument to set the internal control switches 2–13, 3–12, and 3–32 in accordance with the requirements of the user and also for replacement of tubes.

The main part of the rear wall 47 overlying the amplifier compartment 21, which has to be retained in its closed position on the upper amplifier compartment part of the border wall structure 24 is provided along its upper and two side borders with inwardly bent rim sections 51, 52 fitting against the raised shoulder portion 39 of the border wall structure 24 and against its underlying border wall portions. The lower edge of the affixed rear wall 47 terminates along lower border wall section 28 of the amplifier compartment 21 and is slightly displaced in inward direction (Fig. 6) so as to fit against the underlying edge of the intermediate border wall section 48.

Figures 5, 6:
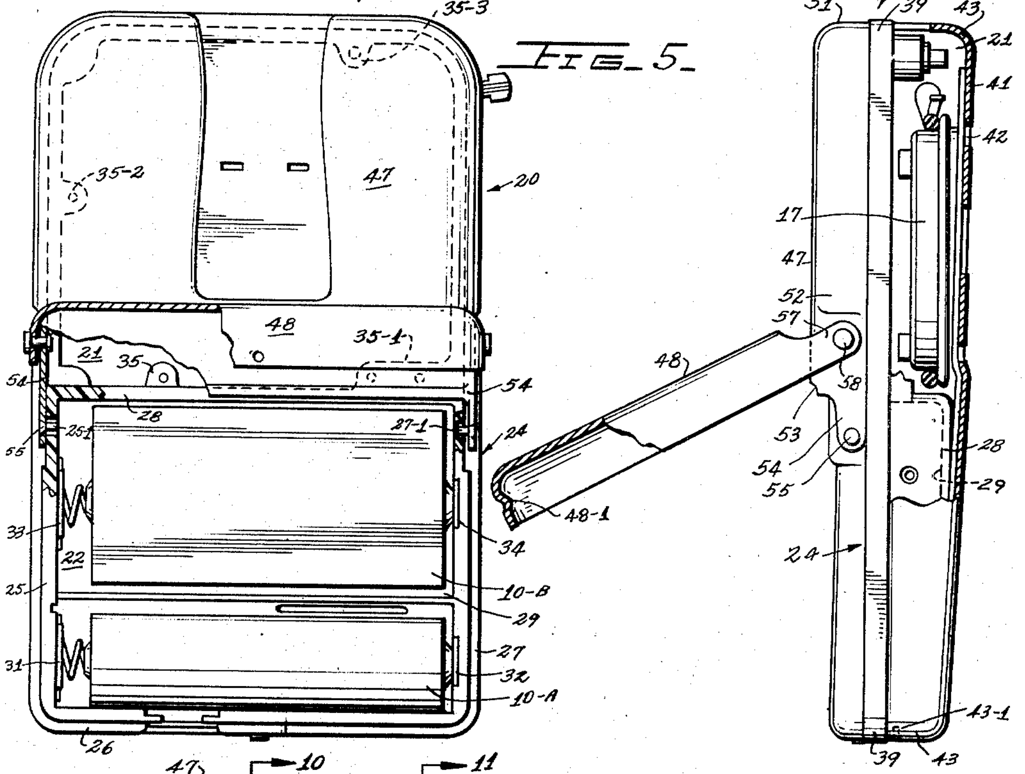
Figs. 5 and 6 are rear views and side views of the amplifier unit with the hinged rear wall section opened.

The two inwardly bent rim sections 52 of the rear wall 47 are provided with tongue-like arm extensions 54 having at their ends pivot pins 55 fitting pivot holes in the underlying border wall sides 25, 27 of the battery compartment so that the rear wall 47 may be tilted on its pivot pins 55 from the closed position shown in Fig. 6 to the dash-line position shown 47–1. Because of their elastic character the side tongue arms 54 of the rear wall 47 may be readily bent in outward direction so as to spring their pivot pins into the pivot holes 25–1, 27–1 of the underlying border wall section for pivotally retaining the rear wall on the border wall structure 24 of the casing. The upper rim 51 of the rear wall 47 is provided with an inwardly extending detent 56 (Fig. 9) arranged to elastically snap into a recess 38–1 provided in the underlying wall portion of the upper border wall section 38, for hingedly retaining the rear wall 47 in its closed position.

The hinged battery wall section 48 of the rear wall 47 is likewise provided with three inwardly extending rim sections arranged to interfit against the underlying wall portion and the raised shoulder 39 of the lower part of the border wall section 24 of the casing so that when the lower hinged wall section 48 is in its closed position, the rear wall 47 with its hinged wall section 48 will have their rear surfaces aligned substantially in a plane. The side rims of the hinged battery wall 48 are provided with tongue-like arm extensions 57 having pivot pins 58 engaging circular pivot holes in the underlying rim section of the rear wall 47 and permit pivotal movement of the hinged battery wall 48 from the open position shown in Fig. 6 to the closed position in which it forms a good enclosure for the battery compartment 22. To retain the hinged rear battery wall 48 in its closed position, its lower border rim section is provided with an inwardly extending detent 48–1 arranged to snap elastically into a locking recess formed in a metal insert 26–1 affixed in the underlying portion of the lower border wall section 26 (Fig. 10). The metallic recess insert 26–1 assures that it does not wear off when the hinged battery compartment wall 48 is frequently closed and opened to replace the batteries.

With the casing wall arrangement described above, the rear wall 47 will normally remain affixed in its closed position to the border wall structure and the user will not disturb it when opening and closing the hinged battery wall section 48 to replace batteries. However, the rear wall 47 may be tilted away from its affixed position on the casing wall structure 24 by first unsnapping the detents 48–1 (Fig. 10) of its upper rim section 52. Thereupon the rear wall 47 may be tilted outwardly on its pivot pins 55 to expose the rear side of the amplifier chassis (Fig. 14) with its terminal control switches 2–13, 3–31, 3–42 and the tube socket structure.

The foregoing arrangement of the rear wall makes it also easy for the person fitting the instrument to release it from its affixed position on the casing wall structure 24 by unsnapping the detents 56 of its upper rim section 51 and swinging the rear wall 47 outwardly on its pivot pins 58 whenever it is desired to adjust the setting of the amplifier elements in accordance with the requirements of the individual user, such as setting the low-cut response switch 2–21, the high-cut response switch 3–31, and the power-level switch 3–21 as for replacing any of the tubes 14, 15, 16.

Similarly, the front wall 41 will be retained in its affixed position on the casing wall structure 24 and will not be released accidentally therefrom. When necessary, however, the front wall 41 may be removed by unsnapping the detents 43–2 of the upper rim section 43 of the front wall 41 (Fig. 9) from their interlocking connection with the underlying recesses of the casing wall structure 38 whereupon the lower detents 43–1 (Fig. 11) of the front wall may be slipped out from the lower border wall recesses in which they are normally retained.

The shallow space of the amplifier 21 is kept flat and small enough so as to be just sufficient to accommodate the flat microphone 17 and the superposed array of tubes 14, 16, 17. The principal structural elements of the amplifier other than the microphone and the tubes are arrayed into a compact chassis structure formed of three chassis arms confined to the upper and side border region of the amplifier compartment 21 with the overall thickness required for accommodating the microphone 17 and the superposed array of tubes which occupy the space between the three arms of the amplifier chassis (Figs. 2, 3, 6, 12, 13, 14, 16).

The chassis structure of the amplifier shown structurally in Figs. 2, 3, 12, 13, 14 is formed of three main sub-assembly units, in the manner indicated diagrammatically in Fig. 1, to wit, a power-switch sub-assembly unit indicated by dash-double-dot enclosure line 2–10, a volume control sub-assembly unit indicated by dash-triple-dot line enclosure 3–10, and a tube-socket sub-assembly unit indicated by dash-quadruple-dot line enclosure 4–10.

As indicated in diagrammatic Fig. 1, the power-switch sub-assembly unit 2–10 (dash-double-dot line) includes the energizing switch structure 2–11, a sub-assembly section indicated by dash-line enclosure 2–20 and embodying the impedance elements 2–C, 3–C, 11–C, 3–R, 14–R, 4–R, 4–C, and a sub-assembly section indicated by dash-line enclosure 2–30 and embodying circuit elements 1–R, 1–C, and 2–R.

As indicated in diagrammatic Fig. 1, the volume control sub-assembly unit 3–10 (dash-triple-dot line) includes the volume control structure 3–11, a sub-assembly section indicated by dash-line enclosure 3–20 and embodying the impedance elements 8–C, 10–R, 11–R, 12–R, and a subassembly section indicated by dash-line enclosure 3–30 and embodying the cord connector structure for cord plug socket 3–40, the power-level switch 3–21, and in addition, the resistor element 13–R, the transformer structure 18, the high-cut switch 3–31, the by-pass condenser 9–C, and the other circuit elements shown in Fig. 1 within the dash-triple-dot line enclosure 3–10 of the volume control sub-assembly unit.

As indicated in diagrammatic Fig. 1, the tube-socket sub-assembly unit 4–10 (dash-quadruple-dot line) includes a socket structure embodying two sets of socket terminals 4–12 of the gain socket section engaged by terminal prongs of the two gain tubes 14, 15, and a set of socket terminals 4–14 of the power socket section engaged by terminal prongs of power tube 16, a sub-assembly section indicated by dash-line enclosure 4–20, and embodying impedances 9–R and 10–C of the amplifier circuit, and the other elements of the amplifier circuit including capacitors 5–C, 7–C, resistors 5–R, 7–R, which are shown within a dash-quadruple-dot line enclosure of the tube socket assembly unit 4–10.

In Figs. 2 to 35 which show the structural arrangement of the various elements of the amplifier shown diagrammatically in Fig. 1, the various sub-assembly units and sub-assembly sections are indicated by the same reference numerals as are shown applied to the sub-assembly units 2–10, 3–10, 4–10, and their sub-assembly sections and circuit elements.

As explained above, the various components of the hearing amplifier are combined into a plurality of assembly units, each of which is separately assembled from component parts, so that they may be readily affixed to each other into the assembled chassis structure occupying a minimum space and, more particularly, a minimum of thickness while assuring that circuit parts tending to feed back disturbing voltage components are kept apart and are electrostatically shielded for suppressing disturbing feed-back action. In addition, circuit parts of the amplifier which are sensitive to humidity and heat are combined into sub-assembly sections which are readily united to the associated parts of the corresponding sub-assembly units after being first treated to withstand attacks of moisture and heat for a prolonged period of use while worn on the body of the user.

Figs. 12 and 14 show the front and rear side of the assembled complete amplifier chassis structure including the tubes, but with the microphone removed. The assembled chassis structure shown in Figs. 12 and 14 is placed into the amplifier compartment 21 of the border wall structure 24 of the casing, and secured as by screws 36, 36–1, 36–2, 36–3, to four lug projections 35, 35–1, 35–2, and 35–3 extending from and constituting integral parts of the four border wall sections bounding the amplifier compartment.

As explained above in connection with the diagrammatic Fig. 1, the amplifier chassis structure is formed of three assembly units, to wit, a power-switch sub-assembly unit 2–10, which is shown in detail in Figs. 18 to 27, a volume control sub-assembly unit 3–10, which is shown in detail in Figs. 28 to 35, and a tube-socket sub-assembly unit 4–10 which is shown in detail in Figs. 15 to 17. Each sub-assembly unit is formed of the components indicated diagrammatically in Fig. 1 by the dash-double-dot line, enclosure 2–10, dash-triple-dot line enclosure 3–10, and dash-quadruple-dot line enclosure 4–10, respectively.

Referring to Figs. 18 to 35, showing the structure of power switch sub-assembly unit 2–10, it comprises a skeleton structure formed of the energizing control switch 2–11 and a stiff frame member 2–41 of sheet metal, which is affixed as by riveting to the exterior of the insulating walls 2–42 forming the housing structure of the switch unit (Figs. 18, 19, 20, 28, 21). The metal frame member 2–41 is part of the cathode or ground circuit of the amplifier and also serves as an electrostatic shield for shielding impedance elements held assembled on opposite sides adjacent thereto to prevent feed-back between circuit portions of different signal potentials. The casing walls 2–44 of the switch unit 3–11 are of insulated molded material and house therein the movable switch arm 2–12.

The main movable switch arm 2–12 of the energizing switch (Fig. 28) is mounted within a compartment enclosed by the two switch walls 2–44. The switch arm 2–12 is held on the inner end of a rotatable shaft 2–45 to the outer end of which is secured the switch actuating member 2–13 which is exposed along the exterior of the casing for actuation by the user as indicated diagrammatically in Fig. 1.

As shown in Fig. 20–A, the shaft 2–45 carrying the movable switch arm 2–12 also carries a resilient detent arm 2–46 of spring metal, for instance, arranged to enter one of three recesses 2–47 formed on the facing inward surface of the switch housing wall 2–44 so that upon actuation of the external actuating arm 2–13 from one switch position to another, the biasing detent 2–46 will snap into the next recess 2–47 and bring the switch contact arm 2–12 to the next switch contact element.

On the exterior of one of the casing walls 2–44 of the switch unit 2–11 are mounted the stationary switch contacts including the insulated switch contact 2–14 which is connected to the A-terminal of the B battery, insulated switch contact 2–15 which leads to the response control capacitor 3–C, and the ground or cathode circuit switch contact 2–16 which is part of an extension 2–42 of the metallic skeleton frame member secured to the exterior of the housing wall 2–44, as by the enlarged end of the switch shaft 2–45 (Figs. 20 to 28). Along one side of the grounded metallic skeleton frame member 2–41 of the power-switch sub-assembly unit 2–10, is held the sub-assembly section 3–20 of impedance elements associated with the screen grid and output circuit of the gain-stage. Along the opposite side of the grounded frame member 2–41 is held the sub-assembly unit 2–30 of the input circuit element of the first gain tube 14 which must be shielded from capacitive coupling with the impedance elements of sub-assembly section 2–20. Thus, as indicated in Fig. 21, resistor element 2–R of sub-assembly 2–30 is mounted to the right of the grounded frame member 2–41 as seen in Fig. 21, and the resistor 1–R with the capacitor 1–C of sub-assembly 3–30 are mounted to the right of the ground member extension 2–48 as seen in Figs. 3, and 18 to 21.

The sub-assembly section 2–30 formed of elements 1–R, 2–R, 1–C is shown in Figs. 26 and 27, and they are affixed in their assembled position to a stiff insulating frame member element 3–51 of thin, but stiff, resin impregnated fibre board. The assembled unit is affixed in its shielded position on the grounded metallic frame member 2–41 by securing the insulating frame sheet element 2–51 to the metallic frame member 2–41 as by a screw 2–52 (Fig. 21).

The sub-assembly unit 2–20 is so positioned on sub-assembly unit 2–10 that metallic sheet portions of the frame member 2–41 are interposed between its impedance elements and the impedance elements 2–R, 1–R, 1–C of the completed sub-assembly unit 2–10, in the manner indicated in Figs. 12, 14 and 18 to 21.

The impedance elements of the sub-assembly section 2–20 are assembled between two spaced thin, stiff, insulating fibre strips 2–54, 2–55 in the manner shown in Figs. 22 to 25. The two insulating frame strips 2–54, 2–55 of sub-assembly unit 2–20 are provided with perforations for receiving therein and securing the wire lead terminals of impedance elements 2–C, 3–C, 4–C, 6–C and resistor elements 4–R, 8–R, 14–R in their assembled positions in the manner shown in Figs. 22 to 25.

The arrangement of the capacitors 2–C, 3–C, 4–C, 6–C, 11–C of the sub-assembly unit 2–20 is shown in cross-section in Fig. 25. These capacitor elements are formed of flat capacitor units assembled in superposed relation to occupy a minimum space and an insulating sheet of thin plastic insulating material 2–57 is wrapped between and around them to provide insulation between their terminal wire conductors 2–C–1, 3–C–1, 4–C–1, 11–C–1 (Fig. 25).

According to the invention, elongated capacitive and resistive impedance elements of a sub-assembly, such as 3–20 shown in Figs. 22 to 25, has its several impedance elements so assembled that notwithstanding the closed spacing between them, adjacent impedance elements which are of different relatively high signal potential and tending to produce undesirable signal feed-back action between them are shielded from each other by an electric surface of one of the impedance elements which is maintained at substantially cathode or ground potential and serves as an electrostatic barrier or shield between them. Thus, when viewing the array of superposed adjacent capacitor elements seen in Fig. 25, the left surface electrode of central capacitor element 4–C, which is connected to the cathode return circuit, at cathode potential serves as an electrostatic shield between the electrode surfaces of the capacitor elements 6–C and 11–C which are of signal potentials which tend to feed-back signal voltages between them. Similarly, the right surface of the surface-electrode of capacitor element 11–C (as seen in Fig.17) is at cathode potential and serves as an electrostatic shield suppressing feedback between relatively high signal voltage electrode surfaces of capacitor elements to the left and resistor elements 4–R, 8–R, positioned to the right thereof (Figs. 25, and Figs. 22, 24).

Figs. 21, 27, also show the lead extensions, 2–81, 2–82, 2–83, 2–84 through which the energizing switch sub-assembly unit 2–10 is connected to terminal portions of the other sub-assembly units in the final chassis assembly structure shown in Figs. 12 and 14, in which the corresponding terminal leads are indicated by corresponding numerals, in the manner indicated in Fig. 1.

The metal frame portion 2–14 which is affixed to the exterior insulating wall of the energizing switch 2–11 (Fig. 20) has pivotally mounted thereon the movable switch arm 2–21 of the auxiliary response control switch of the amplifier. It will be noted that this movable switch arm 2–21 is at the same cathode return potential as the frame member 2–41 on a portion of which it is mounted. Fig. 20 shows the switch arm making contact with the contact elements 2–18 leading to the response control resistor 1–R of sub-assembly section 2–30.

Figs. 28 to 30 show the structure of the volume control sub-assembly unit 3–10 described diagrammatically in connection with Fig. 1. The structure of this sub-assembly unit 3–10 comprises the volume control rheostat 3–11 and the structure of the transformer affixed thereto by a stiff, metallic bracket or frame member 3–51 of sheet metal to constitute another self-supporting stiff sub-assembly skeleton or arm.

Referring to Figs. 28 to 30, the volume control rheostat 3–11 comprises a circular inner wall member 3–15 of molded or resin-impregnated fibrous material which is a good electrical insulator, and serves as support for resistance strip mounted on its inner side facing the circular rheostat actuating member 3–14 which serves as the cover wall of the rheostat. The volume control rheostat 3–11 is of the type described in the co-pending application, Ser. No. 79,194, filed March 2, 1949, by S. L. Richman et al. The rotary actuating member 3–14 is arranged for rotation around a central shaft 3–16 affixed in the inner mounting wall 3–15.

The shaft 3–16 is insulated and serves as an electrical conductor connection to the rheostat contact tap which is rotated by the rotating actuating member. The bracket frame 2–51 is insulatingly supported on the shaft 3–16 and held affixed thereby to the exposed outer side of the mounting member 3–15 of the volume control.

The volume control unit is also combined into a unitary structure with the cord connector or plug socket structure 3–41 which carries the socket terminals through which the amplified output is supplied to the plug terminals of the receiver cord inserted therein. In the form shown, the insulating body of the cord connector socket structure 3–41 is connected to the volume control unit 3–11 by a metal bracket 3–54. On the insulating structure of the cord connector socket 3–41 is also mounted the movable switch arm of the auxiliary switch 3–42 controlling the level of the power output, the cooperating stationary switch contact 3–43 being likewise insulatingly mounted on the insulating body of the cord connector socket 3–41. The resistor 13–R is also shown connected thereto (Figs. 28 to 30) in the manner described in connection with diagrammatic Fig. 1.

The transformer bracket structure 3–51 serves also as a mounting support for the sub-assembly unit 3–20 and formed of impedance elements 11–R, 12–R, 10–R shown in Figs. 31 to 35.

As shown in Fig. 1, the circuit elements of sub-assembly section 3–20 are connected to circuit elements of the power amplification stage of tube 16, and it is essential to prevent feed-back action between them and the impedance elements of sub-assembly section 2–20. By mounting the sub-assembly section 3–20 on and combining it with the volume control skeleton structure, these impedance elements are kept at a distance from the circuit elements of sub-assembly section 2–20 which are combined with the energizing switch sub-assembly unit.

The impedance elements of the self-supporting sub-assembly unit 3–20 are assembled between two stiff insulating strips 3–61 having perforations for receiving and securing the terminal wires of the impedance elements and thus forming them into the sub-assembly. Otherwise, the sub-assembly section 3–20 shown in Figs. 31 to 35 is formed and combined in the manner analogous to that described in connection with the sub-assembly section 2–20 of Figs. 22 to 27.

By arranging the compact impedance sub-assembly sections 2–20, 3–20 in the manner described above, the following advantages are secured: All elements associated with the grid of the first gain tube are at one extreme edge or border of the amplifier chassis. All elements associated with the anode of the first gain tube and with the grid of the second gain tube, except for the volume control, are disposed next above to the foregoing components, but shielded therefrom through the metallic frame member 2–41 of sub-assembly unit 2–10. All components associated with the power tube 16 are on the other extreme far side of the amplifier chassis. All the intermediate coupling elements are on the top of a socket assembly unit, which as will now be described, is assembled and positioned between the two control structures 2–11, 3–11 adjacent the cord socket structure 3–40.

The socket sub-assembly unit 4–10 is shown in detail in Figs. 15 and 16, and comprises a socket structure generally designated 4–41 of molded insulating material or the like having mounted in the interior metallic socket terminals arranged to make detachable contact engagement with terminal prongs of tubes inserted into the socket openings which face downwardly as viewed in Figs. 14, 15. According to the invention the socket structure 4–41 is made of two axially offset socket sections, to wit, a gain section 4–42 in which the two shorter gain tubes 14, 15, are held, and a power socket section 4–43 in which the longer power tube is held. With this arrangement, it is possible to align the free ends of the three tubes at the same level notwithstanding their difference in length, and thus providing a more compact chassis structure utilizing to the utmost advantage all space available within the compact housing.

In order to provide space for the suspension of the microphone between the row of tubes 14, 15, 16, and the front wall 41 of the casing, the free ends of the tubes are held biased over the rear wall by an arrangement of the invention shown in detail in Fig. 13. To this end, a stiff, thin metal sheet member 4–51 is held affixed to the lugs 35, 35–1, extending from the intermediate partition wall member 28 of the border wall structure 24, screws 36 serving to secure the lower edge of the biasing sheet member 4–51 in its biasing position shown.

As will be seen from Figs. 12 and 14, the gain socket section is to the left of the power socket section when viewed from the rear wall with the tubes extending upwardly from the socket structure. Furthermore, as seen from these figures, the power stage tube is next to the outwardly positioned chassis structure associated with the volume control unit 2–11. The first gain tube with the gain socket section is next to the socket arm structure associated with the energizing switch control unit 2–11 at the far other side of the chassis thereby assuring minimum feed-back action and effective spacing between components of different signal potentials tending to feed-back energy and at the same time to provide for maximum compactness.

It will be apparent to those skilled in the art that the novel principles of the invention disclosed herein in connection with specific exemplifications thereof will suggest various other modifications and applications of the same. It is accordingly desired that the present invention shall not be limited to the specific exemplifications shown or described therein.

We claim:

1. In a wearable hearing aid wherein a flat microphone and a flat row of a plurality of midget amplifier tubes are enclosed in at least partially overlapping relation within a generally rectangular compartment of a flat casing small enough for inconspicuous wear in a garment of the user: two self-supporting control structures positioned adjacent two corners of said casing and constituting opposite corner elements of one chassis arm of a self-supporting chassis structure extending along one narrow border of said casing, one of said control structures having an externally actuable energizing switch for selectively energizing said tubes, and also carrying a supplemental switch unit, the other of said control structures having an externally actuable control member for controlling the volume of said amplifier, and also carrying a supplemental switch unit, one of said switch units having a movable switch element actuable to a plurality of positions for selectively setting the frequency response of the amplifier in one part of the frequency range, another of said switch units having a movable switch element actuable to a plurality of positions for selectively setting the frequency response of the amplifier in another part of the frequency range, said one chassis arm bordering an inward space of said compartment sufficient to hold therein said tubes and said microphone.

2. In a wearable hearing aid wherein a flat microphone and a flat row of a plurality of midget amplifier tubes are enclosed in at least partially overlapping relation within a generally rectangular compartment of a flat casing small enough for inconspicuous wear in a garment of the user: two self-supporting control structures positioned adjacent two corners of said casing and constituting opposite corner elements of one chassis arm of a self-supporting chassis structure extending along one narrow border of said casing, one of said control structures having an externally actuable energizing switch for selectively energizing said tubes, and also carrying a supplemental switch unit, the other of said control structures having an externally actuable control member for controlling the volume of said amplifier, and also carrying a supplemental switch unit, a self-supporting connector structure forming part of said chassis structure and having connector elements for detachably connecting thereto detachable terminals of output leads, and also carrying a supplemental switch unit, one of said switch units having a movable switch element actuable to a plurality of positions for selectively setting the frequency response of the amplifier in one part of the frequency range, another of said switch units having a movable switch element actuable to a plurality of positions for selectively setting the frequency response of the amplifier in another part of the frequency range, and a further of said switch units having a movable switch element actuable to a plurality of positions for selectively setting the maximum output level of the amplifier, said one chassis arm bordering an inward space of said compartment sufficient to hold therein said tubes and said microphone.

3. In a hearing aid as claimed in claim 1, both movable switch elements of said energizing switch and of its supplemental switch unit of said one control structure being connected to the low potential circuit side of said amplifier in all positions of said two switch elements.

4. In a hearing aid as claimed in claim 1, an elongated tube socket structure held in position by said two control structures and having a plurality of terminal elements for detachable holding terminal prongs of said row of tubes, said one control structure being nearer to said gain socket section and said other control structure being nearer to said power socket section.

5. In a hearing aid as claimed in claim 1, an elongated tube socket structure held in position by said two control structures and having a plurality of terminal elements for detachably holding terminal prongs of said row of tubes, said one control structure being nearer to said gain socket section and said other control structure being nearer to said power socket section, both movable switch elements of said energizing switch and of its supplemental switch unit of said one control structure being connected to the low potential circuit side of said amplifier in all positions of said two switch elements.

6. In a hearing aid as claimed in claim 2, both movable switch elements of said energizing switch and of its supplemental switch unit of said one control structure being connected to the low potential circuit side of said amplifier in all positions of said two switch elements.

7. In a hearing aid as claimed in claim 2, an elongated tube socket structure held in position by said two control structures and having a plurality of terminal elements for detachably holding terminal prongs of said row of tubes, said one control structure being nearer to said gain socket section and said other control structure being nearer to said power socket section.

8. In a hearing aid as claimed in claim 2, an elongated tube socket structure held in position by said two control structures and having a plurality of terminal elements for detachably holding terminal prongs of said row of tubes, said one control structure being nearer to said gain socket section and said other control structure being nearer to said power socket section, both movable switch elements of said energizing switch and of its supplemental switch unit of said one control structure being connected to the low potential circuit side of said amplifier in all positions of said two switch elements.

9. In a wearable hearing aid wherein a flat microphone and a flat row of a plurality of midget amplifier tubes are enclosed in at least partially overlapping relation within a generally rectangular compartment of a flat casing small enough for inconspicuous wear in a garment of the user: two self-supporting control structures positioned adjacent two corners of said casing and constituting opposite corner elements of one chassis arm of a self-supporting chassis structure extending along one narrow border of said casing, one of said control structures having an externally actuable energizing switch for selectively energizing said tubes, the other of said control structures having an externally actuable control member for controlling the volume of said amplifier, an elongated tube socket structure held in position by said two control structures and having a plurality of terminal elements for detachably holding terminal prongs of said row of tubes, said socket structure having a gain socket section for at least one gain tube and a power socket section for at least one power tube, said gain-socket section being to the left of the power-socket section when viewed from the rear of said casing with the tubes extending from the socket structure in a direction away from the intermediate arm of said chassis structure, said chassis structure having one of said additional chassis arms including a relatively stiff metallic leg member, said chassis structure including at least one amplifier circuit element of amplifier input potential level held along one side of said metallic leg member, and a set of other amplifier circuit elements of a higher order of signal potential held along the opposite side of said metallic leg member for maintaining said circuit elements in mutually shielded operative positions.

10. In a hearing aid as claimed in claim 9, said set of other circuit elements constituting a self-supporting subassembly comprising, a plurality of generally elongated capacitor impedance elements held assembled generally parallel in superposed relation and a plurality of adjacently held generally elongated resistance impedance elements.

References Cited in the file of this patent

UNITED STATES PATENTS

| | | |
|---|---|---|
| 1,704,570 | Lee et al. | Mar. 5, 1929 |
| 2,253,216 | Wenzel | Aug. 19, 1941 |
| 2,444,302 | Lybarger | June 29, 1948 |
| 2,496,683 | Tresise et al. | Feb. 7, 1950 |
| 2,497,963 | Singer | Feb. 21, 1950 |
| 2,499,589 | Kennedy | Mar. 7, 1950 |
| 2,500,301 | Tresise et al. | Mar. 14, 1950 |
| 2,528,498 | Crownover et al. | Nov. 7, 1950 |
| 2,541,811 | Crownover et al. | Feb. 13, 1951 |
| 2,564,425 | Corso et al. | Aug. 14, 1951 |

FOREIGN PATENTS

| | | |
|---|---|---|
| 834,000 | France | Aug. 1, 1938 |